United States Patent
Zhou et al.

(10) Patent No.: US 11,911,896 B2
(45) Date of Patent: Feb. 27, 2024

(54) NANOSCALE POSITIONING APPARATUS WITH LARGE STROKE AND MULTIPLE DEGREES OF FREEDOM AND CONTROL METHOD THEREOF

(71) Applicant: WUXI FRIEDRICH MEASUREMENT AND CONTROL INSTRUMENTS CO., LTD, Wuxi (CN)

(72) Inventors: Fengwei Zhou, Wuxi (CN); Xiaoming Qian, Wuxi (CN); Kai Meng, Wuxi (CN)

(73) Assignee: WUXI FRIEDRICH MEASUREMENT AND CONTROL INSTRUMENTS CO., LTD, Wuxi (CN)

( * ) Notice: Subject to any disclaimer, the term of this patent is extended or adjusted under 35 U.S.C. 154(b) by 24 days.

(21) Appl. No.: 17/764,994

(22) PCT Filed: May 22, 2020

(86) PCT No.: PCT/CN2020/091820
§ 371 (c)(1),
(2) Date: Mar. 30, 2022

(87) PCT Pub. No.: WO2021/217761
PCT Pub. Date: Nov. 4, 2021

(65) Prior Publication Data
US 2022/0402118 A1 Dec. 22, 2022

(30) Foreign Application Priority Data

Apr. 27, 2020 (CN) .......................... 202010344436.8

(51) Int. Cl.
*B25J 9/00* (2006.01)
*G03F 7/00* (2006.01)

(52) U.S. Cl.
CPC ........ *B25J 9/0054* (2013.01); *G03F 7/70725* (2013.01); *G03F 7/70775* (2013.01)

(58) Field of Classification Search
CPC . B25J 7/00; B25J 9/0054; B25J 9/0057; B25J 9/123; B25J 17/0275; B25J 19/0004; B25J 19/021; B25J 19/022; G03F 7/70725; G03F 7/70758; G03F 7/70775; F16C 11/106
See application file for complete search history.

(56) References Cited

U.S. PATENT DOCUMENTS

2003/0106230 A1 * 6/2003 Hennessey ........... H02N 2/0095
33/645

FOREIGN PATENT DOCUMENTS

| CN | 1562578 A | 1/2005 |
|---|---|---|
| CN | 101244559 A | 8/2008 |

(Continued)

OTHER PUBLICATIONS

Dietrich, Aaron. "Comparing Electric Rod Actuators and Hydraulic Cylinders." Machine Design, Dec. 9, 2016, https://www.machinedesign.com/mechanical-motion-systems/hydraulics/article/21832150/comparing-electric-rod-actuators-and-hydraulic-cylinders (Year: 2016).*
CN 104317218 A (Xian-min Zhang) Jan. 28, 2015 (full text). [online] [retrieved on Aug. 23, 2023]. Retrieved from: Clarivate Analytics. (Year: 2015).*
CN 105715667 A (Li-Feng Guo) Jun. 29, 2016 (full text). [online] [retrieved on Aug. 23, 2023]. Retrieved from: Clarivate Analytics. (Year: 2016).*

*Primary Examiner* — Joseph Brown
(74) *Attorney, Agent, or Firm* — Bayramoglu Law Offices LLC

(57) ABSTRACT

A nanoscale positioning apparatus with a large stroke and multiple degrees of freedom and a control method thereof are provided. The nanoscale positioning apparatus includes (Continued)

a base, a plurality of parallel branch chain mechanisms and a working table. Each of the parallel branch chain mechanisms includes an electric cylinder, a micro-motion drive mechanism, a laser interferometer, a grating measuring device, a self-locking upper hinge and a self-locking lower hinge. The top of the base is connected to one end of the electric cylinder through the self-locking lower hinge. The other end of the electric cylinder is connected to one end of the micro-motion drive mechanism. The other end of the micro-motion drive mechanism is connected to the bottom of the working table through the self-locking upper hinge. The positioning apparatus has multiple degrees of freedom, and realizes multi-degree-of-freedom arbitrary position adjustment of the working table through parallel branch chain mechanisms.

9 Claims, 3 Drawing Sheets

(56) References Cited

FOREIGN PATENT DOCUMENTS

| CN | 103878766 | A |   | 6/2014  |             |
|----|-----------|---|---|---------|-------------|
| CN | 104269191 | A |   | 1/2015  |             |
| CN | 104317218 | A | * | 1/2015  | ...... B25J 9/00 |
| CN | 105715667 | A | * | 6/2016  | ...... F16C 11/06 |
| CN | 106142054 | A |   | 11/2016 |             |
| CN | 108481306 | A |   | 9/2018  |             |
| CN | 108582035 | A | * | 9/2018  | ...... B25J 9/00 |
| JP | H08132363 | A |   | 5/1996  |             |

* cited by examiner

NANOSCALE POSITIONING APPARATUS WITH LARGE STROKE AND MULTIPLE DEGREES OF FREEDOM AND CONTROL METHOD THEREOF

CROSS REFERENCE TO THE RELATED APPLICATIONS

This application is the national phase entry of International Application No. PCT/CN2020/091820, filed on May 22, 2020, which is based upon and claims priority to Chinese Patent Application No. 202010344436.8, filed on Apr. 27, 2020, the entire contents of which are incorporated herein by reference.

TECHNICAL FIELD

The present invention belongs to the technical field of high-precision positioning, and relates to a nanoscale positioning apparatus with a large stroke and multiple degrees of freedom and a control method thereof.

BACKGROUND

At present, the rapid development of computers, microelectronics, precision measurement and manufacturing has put forward increasingly high requirements for high-precision nanoscale measurement and control. The nanoscale positioning working table is the basis of related work, and the high-precision positioning and driving requires a precision system. In the common processing scheme, the small-stroke micron-scale movement and high-precision positioning of a single axis or a few axes is achieved by means of piezoelectric drive. In practical applications, if a large stroke is involved, it needs to set up an additional working table or carry out secondary adjustment and mounting, which affects the precision and efficiency, and brings many problems to use and measurement.

With the popularization of nano-drive, computer control and measurement, and servo control, the large-stroke electric servo mechanism is integrated with the nano-drive mechanism, and key control, locking and data acquisition are realized through the computer. These advances make it possible for a nanoscale positioning working table with a large stroke and multiple degrees of freedom, which will have a broad application prospect in high-precision semi-conductors and other fields.

SUMMARY

An objective of the present invention is to provide a nanoscale positioning apparatus with a large stroke and multiple degrees of freedom and a control method thereof. The present invention satisfies the requirement of nanoscale positioning with a large stroke and multiple degrees of freedom, and overcomes the problems of small stroke and low efficiency caused by multiple adjustments in the prior art.

The present invention adopts the following technical solution. A nanoscale positioning apparatus with a large stroke and multiple degrees of freedom, wherein the apparatus includes a base, a plurality of parallel branch chain mechanisms and a working table; two sides of the plurality of parallel branch chain mechanisms are connected to the base and the working table through hinge base supporting pieces, respectively; each of the branch chain mechanisms includes an electric cylinder, a micro-motion drive mechanism, a laser interferometer, a grating measuring device, a self-locking upper hinge and a self-locking lower hinge; a top of the base is connected to one end of the electric cylinder through the self-locking lower hinge; the other end of the electric cylinder is connected to one end of the micro-motion drive mechanism; the other end of the micro-motion drive mechanism is connected to a bottom of the working table through the self-locking upper hinge; the laser interferometer is provided on a side of the working table; and the grating measuring device is provided on the electric cylinder.

Further, the cylinder body end of the electric cylinder may be connected to the top of the base through the self-locking lower hinge; the piston end of the electric cylinder may be connected to the one end of the micro-motion drive mechanism; and the micro-motion drive mechanism may be driven by a piezoelectric ceramic driver; and the grating measuring device may be a grating scale; and a main scale of the grating scale may be provided at the cylinder body of the electric cylinder, and a grating reader may be provided at the piston end of the electric cylinder.

Further, the self-locking upper hinge may include a first spherical-hinge base and a second spherical-hinge base; the first spherical-hinge base may be hinged to the bottom of the working table through a first pin shaft; one side of the first spherical-hinge base may be provided with a first fixed arc groove, and the other side of the first spherical-hinge base may be connected to an electromagnet; the second spherical-hinge base may be hinged to the bottom of the working table through a second pin shaft; one side of the second spherical-hinge base may be provided with a second fixed arc groove; a steel ball may be provided in the first fixed arc groove and the second fixed arc groove; the first spherical-hinge base may be provided with a first through hole, and the second spherical-hinge base may be provided with a second through hole; a pull rod may be provided in the first through hole and the second through hole; one end of the pull rod may be hinged to the second spherical-hinge base through a third pin shaft; the other end of the pull rod may be exposed out of the first through hole, and a magnetic plate may be provided at the other end of the pull rod; one end of the magnetic plate may be located on a side of the electromagnet; a spring may be provided between the first spherical-hinge base and the magnetic plate; and a lower end portion of the steel ball may be connected to an upper end of the micro-motion drive mechanism.

Further, the electromagnet may be a sucker-type circular electromagnet with an attraction force of 20 KG.

Further, the spring may be sleeved on a periphery of the pull rod.

Further, the self-locking lower hinge is structurally identical to the self-locking upper hinge.

Further, the hinge base supporting pieces may be evenly distributed on the top of the base, and correspondingly, the hinge base supporting pieces may be evenly distributed at the bottom of the working table; and the self-locking upper hinge and the self-locking lower hinge may be respectively connected to the hinge base supporting pieces.

A control method of a nanoscale positioning apparatus with a large stroke and multiple degrees of freedom includes the following steps:

step 1: arranging a base, branch chain mechanisms and a working table, wherein each of the branch chain mechanisms includes an electric cylinder, an electromagnet, a micro-motion drive mechanism, a laser interferometer, a grating measuring device, a self-locking upper hinge and a self-locking lower hinge;

further arranging a first acquisition unit, a second acquisition unit and a computer, wherein the grating measuring device is connected to the first acquisition unit through a wire; the laser interferometer is connected to the second acquisition unit through a wire; the first acquisition unit and the second acquisition unit are connected to the computer through wires, respectively; and the computer is connected to a servo drive system of the electric cylinder, an electromagnetic drive system of the electromagnet and a piezoelectric drive system of the micro-motion drive mechanism through wires, respectively;

step 2: driving, by the computer, the servo drive system of the electric cylinder, so as to drive a piston end of the electric cylinder to move; transmitting, by the grating measuring device, a movement amount of a grating reader to the computer through the first acquisition unit; and when the electric cylinder moves for a required amount, driving, by the computer, the electric cylinder to stop;

step 3: starting, by the computer, a piezoelectric ceramic driver in the piezoelectric drive system of the micro-motion drive mechanism; driving, by the piezoelectric ceramic driver, the micro-motion drive mechanism to move in a vertical direction; and measuring, by the laser interferometer, a movement amount of the working table, and transmitting the movement amount of the working table to the computer through the second acquisition unit; and step 4: receiving, by the computer, the movement amount of the working table; and when a specified amount is reached, driving, by the computer, the self-locking lower hinge and the self-locking upper hinge to achieve self-locking.

Further, in step 4, the computer may de-energize the electromagnet, such that a magnetic force between the electromagnet and a magnetic plate may disappear, and a spring may rebound from a compressed state; an upper part of the spring may push the magnetic plate to move upward, and a second spherical-hinge base may be driven to rotate around a second pin shaft through a pull rod; the second spherical-hinge base may rotate counterclockwise around the second pin shaft; a gap between the first spherical-hinge base and the second spherical-hinge base may be reduced, and a clamping force received by a steel ball in a first fixed arc groove and a second fixed arc groove may be increased, so as to lock the steel ball; in this way, the self-locking upper hinge may complete self-locking; and the self-locking lower hinge may self-lock the same as the self-locking upper hinge.

Compared with the prior art, the present invention has the follow advantages:

1. The present invention features a simple structure, a large stroke and high precision. The present invention realizes a large-stroke high-precision working table through a large-stroke high-precision drive structure, making up for the defect of traditional technology with high precision but small stroke.
2. The present invention has multiple degrees of freedom, and realizes arbitrary position adjustment of multiple degrees of freedom through the parallel robot mechanisms, so as to meet various positioning requirements.
3. The present invention has a high automation level, and realizes the entire positioning and control operations through a computer, which can efficiently implement positioning and improve use efficiency.

DETAILED DESCRIPTION OF THE EMBODIMENTS

Figure 1:
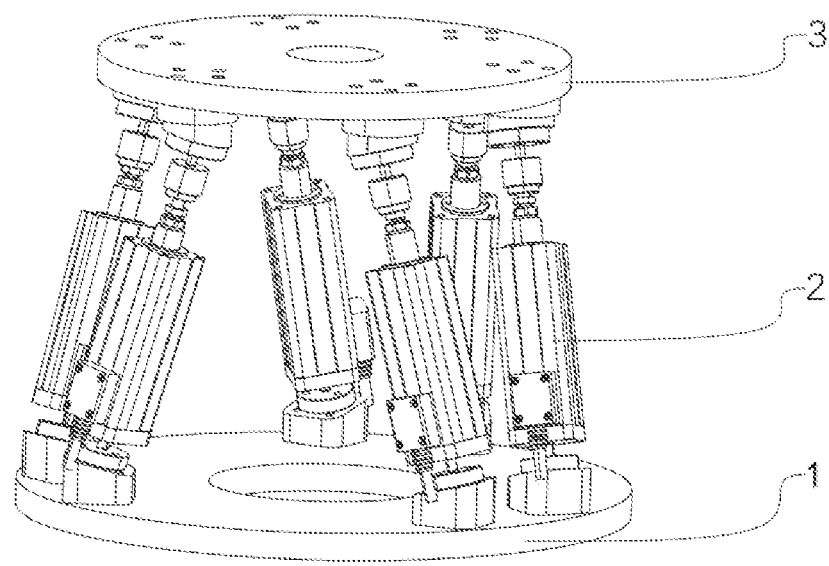
FIG. 1 is a schematic view of a positioning apparatus according to the present invention.

The specific implementations of the present invention are further described below with reference to the drawings.

FIGS. 1 to 5 show the components used herein, including a base 1, branch chain mechanisms 2, a working table 3, self-locking upper hinges 21, a micro-motion drive mechanism 22, a piezoelectric ceramic 23, an electric cylinder 24, a self-locking lower hinge 25, a first spherical-hinge base 211, a second spherical-hinge base 212, a spring 213, a pull rod 214, an electromagnet 215, a magnetic plate 216, a first pin shaft 217, a second pin shaft 218, a steel ball 219, a third pin shaft 220, a micro-motion drive base 32 and a computer.

As shown in FIG. 1, the present invention provides a nanoscale positioning apparatus with a large stroke and multiple degrees of freedom, which includes a base 1, parallel branch chain mechanisms 2 and a working table 3.

Figure 2:
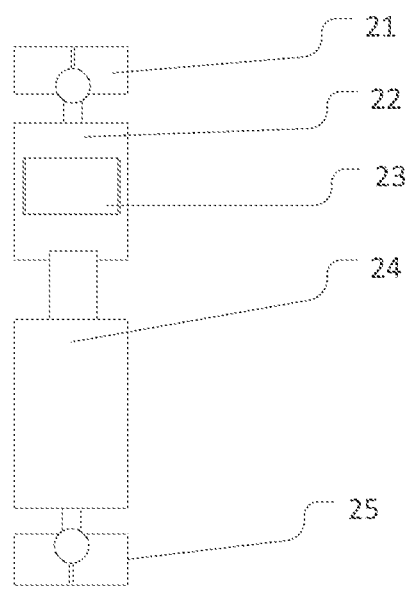
FIG. 2 is a structural view of branch chains according to the present invention.

Referring to FIG. 2, each of the parallel branch chain mechanisms 2 includes a self-locking upper hinge 21, a micro-motion drive mechanism 22, an electric cylinder 24 and a self-locking lower hinge 25. One end of the electric cylinder 24 is connected to a top of the base 1 through the self-locking lower hinge 25. The other end of the electric cylinder 24 is connected to one end of the micro-motion drive mechanism 22. The other end of the micro-motion drive mechanism 22 is connected to a bottom of the working table 3 through the self-locking upper hinge 21.

In this embodiment, the cylinder body end of the electric cylinder 24 is connected to the top of the base 1 through the self-locking lower hinge 25, and the piston end of the electric cylinder 24 is connected to the one end of the micro-motion drive mechanism 22.

In order to measure a telescopic displacement of the electric cylinder 24, a grating scale device is provided. A main scale of the grating scale device is provided at the cylinder body of the electric cylinder 24, and a grating reader is provided at the piston end of the electric cylinder 24. When the piston end of the electric cylinder 24 expands and contracts, real-time data is transmitted to the grating scale. In this embodiment, the electric cylinder 24 is a servo electric cylinder, which is an Exlar GX20 series 12 mm-stroke electric cylinder, featuring high thrust repeatability and accurate position control. In order to measure the telescopic displacement of the electric cylinder, a grating scale device is provided, using HEIDENHAIN's LIP 382 series ultra-high-precision linear grating scale with a measuring range of 70 mm.

The other end of the micro-motion drive mechanism 22 is connected to the bottom of the working table 3 through the self-locking upper hinge 21. The micro-motion drive mechanism 22 is driven by a piezoelectric ceramic driver. In this embodiment, the micro-motion drive mechanism 22 is a Q-Motion series Q521 small linear working table of Physik Instrumente (PI), with a minimum displacement up to 2 nm. The linear working table 3 uses an integrated incremental encoder for direct position measurement with a resolution of 1 nm.

Meanwhile, in order to achieve precise positioning of the working table, a laser interferometer is provided on one side of the apparatus to measure the position of the working table to monitor the movement amount of the working table 3 in a height direction in real time. The laser interferometer comes from the Renishaw's XL-80 series, which has a measurement precision of ±0.5 ppm and a resolution of 1 nm.

Figure 3:
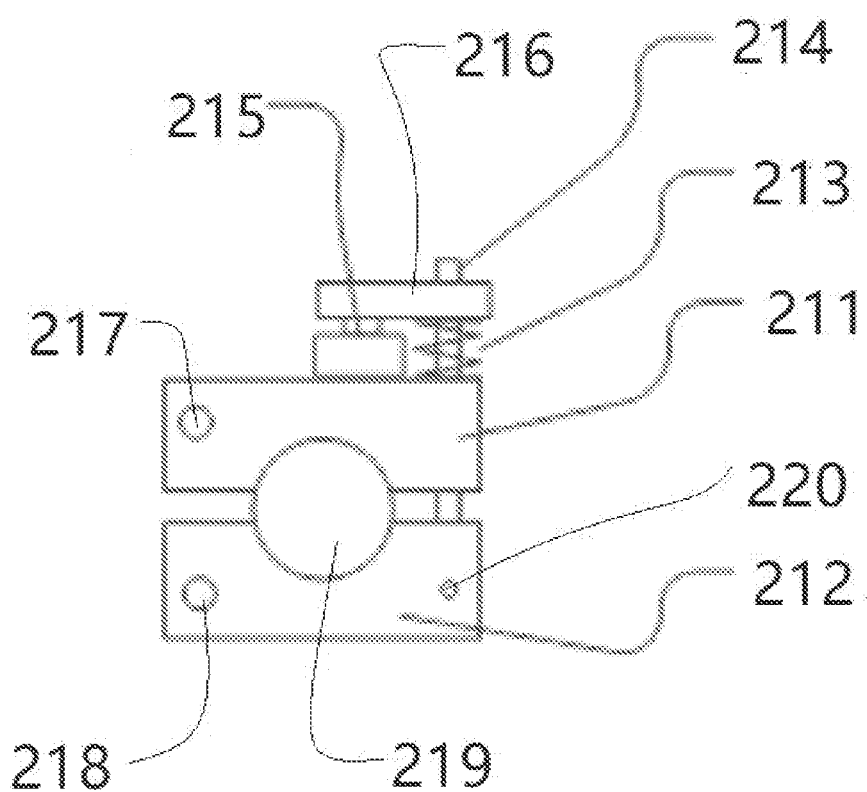
FIG. 3 a top view of a self-locking upper hinge according to the present invention.

Referring to FIG. 3, in the present invention, the self-locking upper hinge 21 includes a first spherical-hinge base 211, a second spherical-hinge base 212, a spring 213, a pull rod 214, an electromagnet 215, a magnetic plate 216, a first pin shaft 217, a second pin shaft 218, a steel ball 219 and a third pin shaft 220. The first spherical-hinge base 211 is hinged to the bottom of the working table 3 through the first pin shaft 217. One side of the first spherical-hinge base 211 is provided with a first fixed arc groove, and the other side of the first spherical-hinge base 211 is connected to the electromagnet 215 through a threaded structure. The electromagnet 215 is a sucker-type circular electromagnet with an attraction force of 20 KG. The second spherical-hinge base 212 is hinged to the bottom of the working table 3 through the second pin shaft 218. One side of the second spherical-hinge base 212 is provided with a second fixed arc groove. A steel ball 219 is provided in the first fixed arc groove and the second fixed arc groove.

The first spherical-hinge base 211 is provided with a first through hole, and the second spherical-hinge base 212 is provided with a second through hole. The pull rod 214 is provided in the first through hole and the second through hole. One end of the pull rod 214 is hinged to the second spherical-hinge base 212 through the third pin shaft 220. The other end of the pull rod 214 is exposed out of the first through hole, and the magnetic plate 216 is provided at the other end of the pull rod 214. The magnetic plate 216 is made of a magnetic material. One end of the magnetic plate 216 is located on a side of the electromagnet 215. The spring 213 is provided between the first spherical-hinge base 211 and the magnetic plate 216. The spring 213 is sleeved on a periphery of the pull rod 214. A lower end portion of the steel ball 219 is connected to an upper end of the micro-motion drive mechanism.

When the working table 3 is raised, the electromagnet 215 is in an electrified state. The electromagnet 215 attracts the magnetic plate 216 to move downward. A magnetic force between the electromagnet 215 and the magnetic plate 216 overcomes an elastic force of the spring 213. The magnetic plate 216 drives the second spherical-hinge base 212 to rotate around the second pin shaft 218 through the pull rod 214. In FIG. 3, the second spherical-hinge base 212 rotates clockwise around the second pin shaft 218. A gap between the first spherical-hinge base 211 and the second spherical-hinge base 212 increases. Therefore, a clamping force received by the steel ball 219 in the first fixed arc groove and the second fixed arc groove is reduced, so the steel ball 219 can rotate.

The self-locking lower hinge 25 is structurally identical to the self-locking upper hinge 21. A spherical-hinge base in the self-locking lower hinge 25 is provided on the top of the base 1, and an upper end of a steel ball in the self-locking lower hinge 25 is connected to the cylinder body end of the electric cylinder 24.

The base 1 is provided with six threaded holes evenly distributed at 60° for setting hinge base supporting pieces. The bottom of the working table 3 is also provided with six evenly distributed threaded holes corresponding to those on the base 1. In this way, the parallel branch chains 2 have a consistent amount of movement, and the working table 3 remains stable during an ascending process.

The two sides of the parallel branch chains 2 are connected to the base 1 and the working table 3 through the hinge base supporting pieces, respectively. The hinge base supporting pieces are connected to a top surface of the base 1 and a bottom surface of the working table 3 through bolts.

The spherical-hinge bases in the self-locking lower hinges 25 are provided on the hinge base supporting pieces on the top of the base 1. The first spherical-hinge bases 211 and the second spherical-hinge bases 212 are arranged on the hinge base supporting pieces at the bottom of the working table 3.

Figure 4:
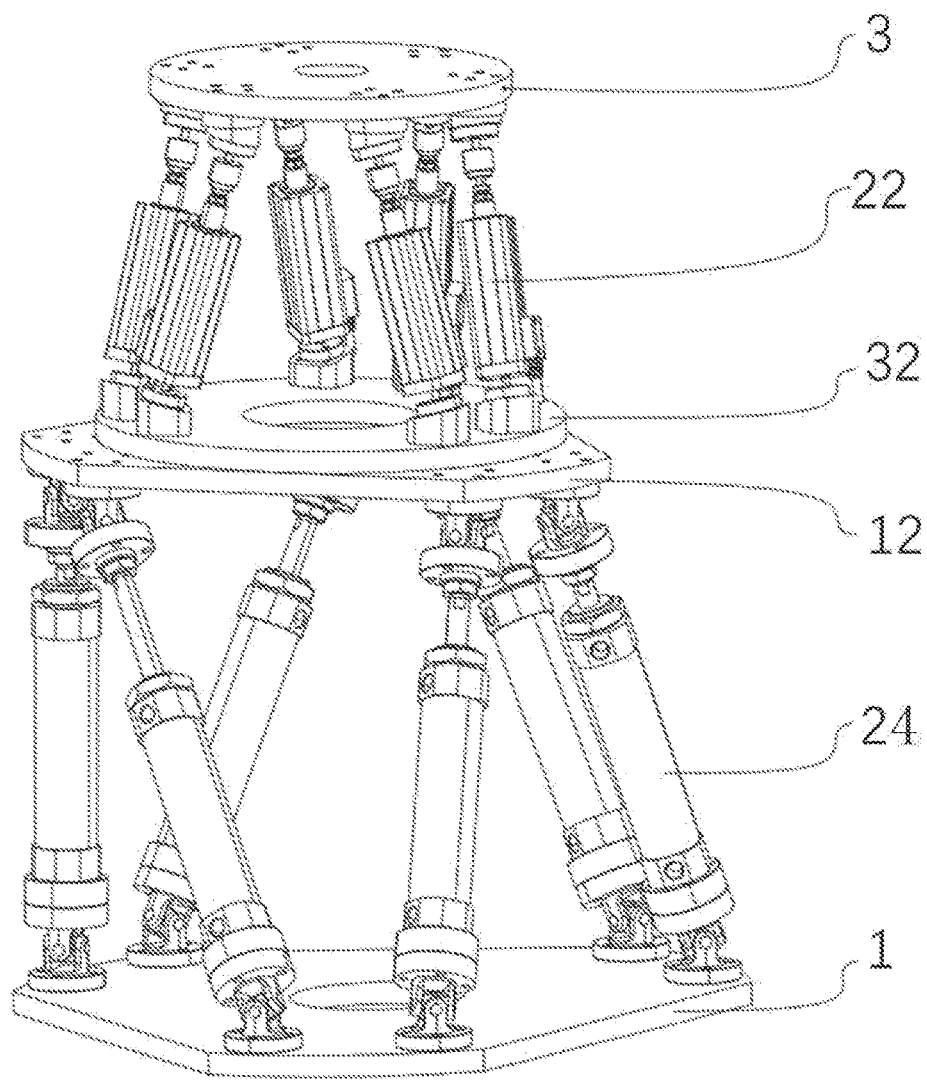
FIG. 4 is a structural view of another embodiment of the present invention.

Referring to FIG. 4, another embodiment of the present invention provides a nanoscale positioning apparatus with a large stroke and multiple degrees of freedom, which includes a base 1. A top of the base 1 is hinged to a cylinder body end of an electric cylinder 24 through a hinge. A piston end of the electric cylinder 24 is hinged to a bottom of an electric working table 12 through a hinge. An upper part of the electric working table 12 is provided with a micro-motion drive base 32. A top of the micro-motion drive base 32 is fixedly connected to one end of a micro-motion drive mechanism 22 through a bolt. The other end of the micro-motion drive mechanism 22 is fixedly connected to a bottom of a working table 3 through a bolt. In this embodiment, in order to achieve a wide-range motion requirement, the electric cylinder 24 in the lower half of the apparatus is a large-scale SEA801 series electric cylinder, fabricated by Shanghai Jiwang Electromechanical Technology Co., Ltd., with a maximum stroke of 500 mm.

Figure 5:
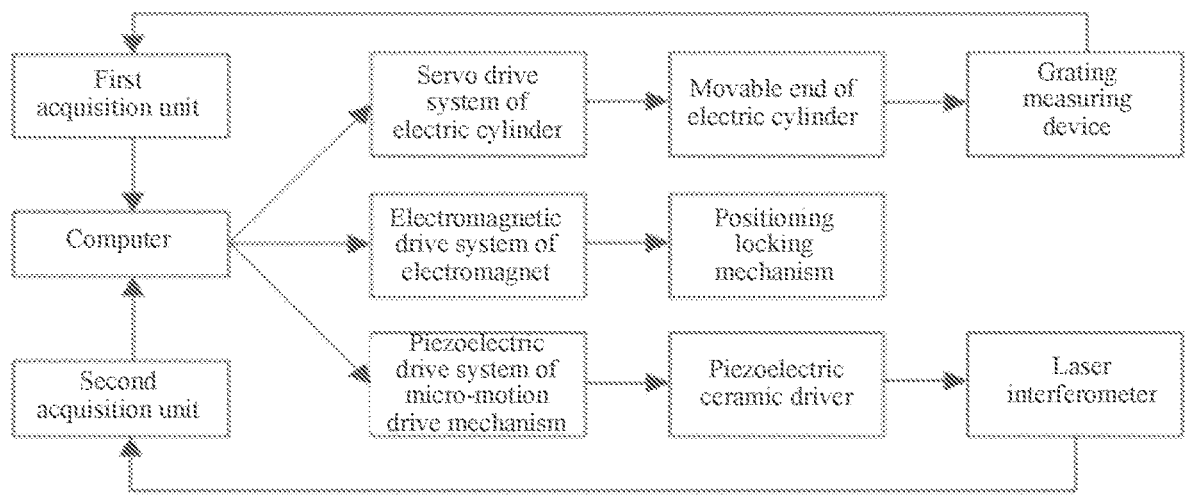
FIG. 5 is a flowchart of a control method according to the present invention.

Referring to FIG. 5, a grating scale of a grating measuring device is connected to a first acquisition unit through a wire. A laser interferometer is connected to a second acquisition unit through a wire. The first acquisition unit and the second acquisition unit are connected to a computer through wires. The computer is connected to a servo drive system of the electric cylinder 24, an electromagnetic drive system of an electromagnet 215 and a piezoelectric drive system of the micro-motion drive mechanism 22 through wires. The computer is an Advantech UNO-2372G-J021AE series fanless embedded industrial control computer. The electric cylinder 24 is provided with an incremental encoder. A 1VPP interface signal connected to the grating scale uses a Modbus IO module of Advantech's ADAM-6017. An analog-to-digital (AD) precision of this module reaches 16 bits, and acquired data is provided to the computer for reading by means of Modbus slave.

For the drive of the electromagnet 215, Advantech's ADAM-6017 module has a digital output port. The computer controls the digital output port through a Modbus protocol, and then controls the on-off of the electromagnet 215 through a relay. The drive of the micro-motion module uses PI's E-873 Q-Motion servo controller. The computer controls the servo controller through an RJ45 network port, and then controls the micro-motion drive mechanism 22. The computer reads the measurement data of the laser interferometer on the working table through a universal serial bus (USB) port.

A control method of a nanoscale positioning apparatus with a large stroke and multiple degrees of freedom includes the following steps:

Step 1: A base 1, branch chain mechanisms 2 and a working table 3 are arranged. Each of the branch chain mechanisms 2 includes an electric cylinder 24, an electromagnet 215, a micro-motion drive mechanism 22, a laser interferometer, a grating measuring device, a self-locking upper hinge 21 and a self-locking lower hinge 25.

A first acquisition unit, a second acquisition unit and a computer are also arranged. The grating measuring device is connected to the first acquisition unit through a wire. The laser interferometer is connected to the second acquisition unit through a wire. The first acquisition unit and the second acquisition unit are connected to the computer through wires, respectively. The computer is connected to a servo drive system of the electric cylinder 24, an electromagnetic drive system of the electromagnet 215 and a piezoelectric drive system of the micro-motion drive mechanism 22 through wires, respectively.

Step 2: The computer drives the servo drive system of the electric cylinder 24 to drive a piston end of the electric cylinder 24 to move. The grating measuring device transmits a movement amount of a grating reader to the computer through the first acquisition unit. The electric cylinder 24 moves for a required amount, the computer drives the electric cylinder 24 to stop.

Step 3: The computer starts a piezoelectric ceramic driver in the piezoelectric drive system of the micro-motion drive mechanism 22. The piezoelectric ceramic driver drives the micro-motion drive mechanism 22 to move in a vertical direction. The laser interferometer measures a movement amount of the working table 3 and transmits it to the computer through the second acquisition unit.

Step 4: The computer receives the movement amount of the working table 3; and when a specified amount is reached, the computer drives the self-locking lower hinge 25 and the self-locking upper hinge 21 to achieve self-locking.

A specific self-locking process is as follows. Taking the self-locking upper hinge 21 as an example, the computer de-energizes the electromagnet 215, such that a magnetic force between the electromagnet 215 and a magnetic plate 216 disappears, and a spring 213 rebounds from a compressed state. An upper part of the spring 213 pushes the magnetic plate 216 to move upward, and a second spherical-hinge base 212 is driven to rotate around a second pin shaft 218 through a pull rod 214. In FIG. 3, the second spherical-hinge base 212 rotates counterclockwise around the second pin shaft 218. A gap between the first spherical-hinge base 211 and the second spherical-hinge base 212 is reduced. Therefore, a clamping force received by a steel ball 219 in a first fixed arc groove and a second fixed arc groove is increased, so as to lock the steel ball 219. The self-locking lower hinge 25 completes self-locking in the same way as the self-locking upper hinge.

What is claimed is:

1. A nanoscale positioning apparatus with a stroke greater than a micron-scale movement and multiple degrees of freedom, comprising a base, a plurality of parallel branch chain mechanisms and a working table; wherein two sides of the plurality of parallel branch chain mechanisms are connected to the base and the working table through a first plurality of hinge base supporting pieces and a second plurality of hinge base supporting pieces, respectively;

each of the parallel branch chain mechanisms comprises an electric cylinder, a micro-motion drive mechanism, a laser interferometer, a grating measuring device, a self-locking upper hinge and a self-locking lower hinge;

a top of the base is connected to a first end of the electric cylinder through the self-locking lower hinge;

a second end of the electric cylinder is connected to a first end of the micro-motion drive mechanism;

a second end of the micro-motion drive mechanism is connected to a bottom of the working table through the self-locking upper hinge;

and the grating measuring device is provided on the electric cylinder, wherein the self-locking upper hinge comprises a first spherical-hinge base and a second spherical-hinge base;

the first spherical-hinge base is hinged to the bottom of the working table through a first pin shaft;

a first side of the first spherical-hinge base is provided with a first fixed arc groove, and a second side of the first spherical-hinge base is connected to an electromagnet;

the second spherical-hinge base is hinged to the bottom of the working table through a second pin shaft;

one side of the second spherical-hinge base is provided with a second fixed arc groove;

a steel ball is provided in the first fixed arc groove and the second fixed arc groove;

the first spherical-hinge base is provided with a first through hole, and the second spherical-hinge base is provided with a second through hole;

a pull rod is provided in the first through hole and the second through hole;

a first end of the pull rod is hinged to the second spherical-hinge base through a third pin shaft;

a second end of the pull rod is exposed out of the first through hole, and a magnetic plate is provided at the second end of the pull rod;

one end of the magnetic plate is located on a side of the electromagnet;

a spring is provided between the first spherical-hinge base and the magnetic plate; and a lower end portion of the steel ball is connected to an upper end of the micro-motion drive mechanism.

2. The nanoscale positioning apparatus according to claim 1, wherein the first end of the electric cylinder is connected to the top of the base through the self-locking lower hinge, wherein the first end of the electric cylinder is a cylinder body end;

the second end of the electric cylinder is connected to the first end of the micro-motion drive mechanism, wherein the second end of the electric cylinder is a piston end; and the micro-motion drive mechanism is driven by a piezoelectric ceramic driver.

3. The nanoscale positioning apparatus according to claim 2, wherein
the grating measuring device is a grating scale; and
a main scale of the grating scale is provided at the cylinder body end of the electric cylinder, and a grating reader is provided at the piston end of the electric cylinder.

4. The nanoscale positioning apparatus according to claim 1, wherein
the electromagnet is a circular electromagnet with an attraction force of 20 KG.

5. The nanoscale positioning apparatus according to claim 1, wherein
the spring is sleeved on a periphery of the pull rod.

6. The nanoscale positioning apparatus according to claim 1, wherein
the self-locking lower hinge is structurally identical to the self-locking upper hinge.

7. The nanoscale positioning apparatus according to claim 1, wherein
the first plurality of hinge base supporting pieces are evenly distributed on the top of the base, and correspondingly, the second plurality of hinge base supporting pieces are evenly distributed at the bottom of the working table; and
the self-locking upper hinge and the self-locking lower hinge are respectively connected to each of the second plurality of hinge base supporting pieces and each of the first plurality of hinge base supporting pieces.

8. A control method of a nanoscale positioning apparatus with a stroke greater than a micron-scale movement and multiple degrees of freedom, comprising the following steps:
step 1: arranging a base, branch chain mechanisms, a working table, a first acquisition unit, a second acquisition unit and a computer, wherein
each of the branch chain mechanisms comprises an electric cylinder, an electromagnet, a micro-motion drive mechanism, a laser interferometer, a grating measuring device, a self-locking upper hinge and a self-locking lower hinge, two sides of each parallel branch chain mechanism being connected to the base and the working table through a first plurality of hinge base supporting pieces and a second plurality of hinge base supporting pieces, respectively;
a top of the base is connected to a first end of the electric cylinder through the self-locking lower hinge;
a second end of the electric cylinder is connected to a first end of the micro-motion drive mechanism;
a second end of the micro-motion drive mechanism is connected to a bottom of the working table through the self-locking upper hinge;
the grating measuring device is provided on the electric cylinder;
the grating measuring device is connected to the first acquisition unit through a first wire;
the laser interferometer is connected to the second acquisition unit through a second wire;
the first acquisition unit and the second acquisition unit are connected to the computer through a third wire and a fourth wire, respectively; and
the computer is connected to a servo drive system of the electric cylinder, an electromagnetic drive system of the electromagnet and a piezoelectric drive system of the micro-motion drive mechanism through a fifth wire, a sixth wire and a seventh wire, respectively;
step 2: driving, by the computer, the servo drive system of the electric cylinder, so as to drive a piston end of the electric cylinder to move; transmitting, by the grating measuring device through the first acquisition unit, a movement amount of a grating reader to the computer; and when the electric cylinder moves for a required amount, driving, by the computer, the electric cylinder to stop;
step 3: starting, by the computer, a piezoelectric ceramic driver in the piezoelectric drive system of the micro-motion drive mechanism; driving, by the piezoelectric ceramic driver, the micro-motion drive mechanism to move in a vertical direction; and measuring, by the laser interferometer, a movement amount of the working table, and transmitting the movement amount of the working table to the computer through the second acquisition unit; and
step 4: receiving, by the computer, the movement amount of the working table; and when a specified amount is reached, driving, by the computer, the self-locking lower hinge and the self-locking upper hinge to achieve self-locking,
wherein
the self-locking upper hinge comprises a first spherical-hinge base and a second spherical-hinge base;
the first spherical-hinge base is hinged to the bottom of the working table through a first pin shaft;
a first side of the first spherical-hinge base is provided with a first fixed arc groove, and a second side of the first spherical-hinge base is connected to an electromagnet;
the second spherical-hinge base is hinged to the bottom of the working table through a second pin shaft;
one side of the second spherical-hinge base is provided with a second fixed arc groove;
a steel ball is provided in the first fixed arc groove and the second fixed arc groove;
the first spherical-hinge base is provided with a first through hole, and the second spherical-hinge base is provided with a second through hole;
a pull rod is provided in the first through hole and the second through hole;
a first end of the pull rod is hinged to the second spherical-hinge base through a third pin shaft;
a second end of the pull rod is exposed out of the first through hole, and a magnetic plate is provided at the second end of the pull rod;
one end of the magnetic plate is located on a side of the electromagnet;
a spring is provided between the first spherical-hinge base and the magnetic plate; and
a lower end portion of the steel ball is connected to an upper end of the micro-motion drive mechanism.

9. The control method according to claim 8, wherein in step 4, the computer de-energizes the electromagnet, wherein a magnetic force between the electromagnet and the magnetic plate disappears, and the spring rebounds from a compressed state; an upper part of the spring pushes the magnetic plate to move upward, and the second spherical-hinge base is driven to rotate around the second pin shaft through the pull rod; the second spherical-hinge base rotates counterclockwise around the second pin shaft; a gap between the first spherical-hinge base and the second spherical-hinge base is reduced, and a clamping force received by the steel ball in the first fixed arc groove and the second fixed arc groove is increased, so as to lock the steel ball; in this way, the self-locking upper hinge completes self-locking;

and the self-locking lower hinge completes self-locking in the same way as the self-locking upper hinge.

\* \* \* \* \*